US006744313B2

(12) United States Patent
Genest

(10) Patent No.: US 6,744,313 B2
(45) Date of Patent: Jun. 1, 2004

(54) POWER AMPLIFIER DRIVER AND METHOD OF USING

(75) Inventor: Pierre Andre Genest, Rouffiac Tolosan (FR)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 39 days.

(21) Appl. No.: 10/138,973

(22) Filed: May 2, 2002

(65) Prior Publication Data

US 2003/0206057 A1 Nov. 6, 2003

(51) Int. Cl.[7] .................................................. H03G 3/20
(52) U.S. Cl. ........................................ 330/129; 330/141
(58) Field of Search .............................. 330/129, 140, 330/141

(56) References Cited

U.S. PATENT DOCUMENTS 5,150,075 A     9/1992 Hietala et al. .............. 330/279
5,376,895 A  * 12/1994 Aihara ....................... 330/129
5,448,770 A     9/1995 Hietala et al. .............. 455/126
5,617,060 A  *  4/1997 Wilson et al. ............... 330/129

* cited by examiner

Primary Examiner—Robert Pascal
Assistant Examiner—Khanh Van Nguyen
(74) Attorney, Agent, or Firm—James J. Stipanuk

(57) ABSTRACT

A power amplifier driver (16) provides control voltage inputs to power amplifier (14) at terminal (OUT). An output power control loop is implemented through directional coupler (20) and power amplifier driver (16). Power amplifier driver (16) implements a loop integration function utilizing transconductance amplifiers (60, 62) to convert a detection signal (DET) and a reference signal (REF2) to current for summing at node 58. Transconductance amplifiers (70,72) convert the error voltage generated at node (34) and bias voltage ($V_{min}$) to current for summing at node (36) for subsequent conversion back to voltage by resistor (74). The error voltage at node (36) is buffered (26) to provide adequate current drive at terminal (OUT).

19 Claims, 7 Drawing Sheets

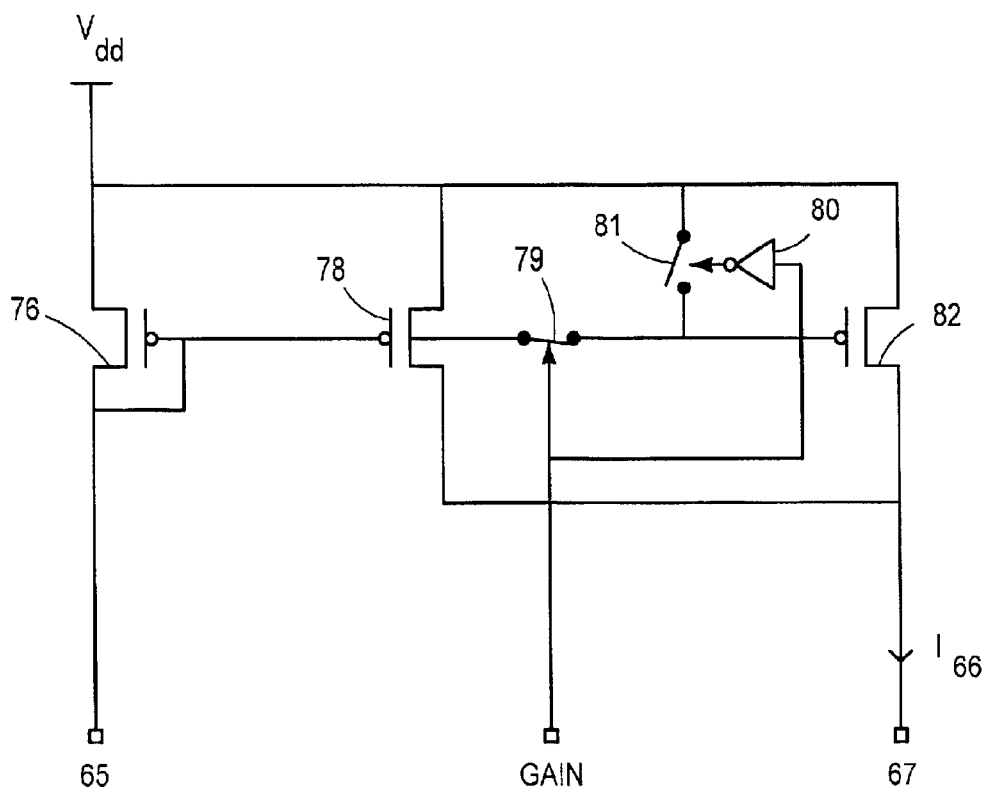
FIG. 5

POWER AMPLIFIER DRIVER AND METHOD OF USING

BACKGROUND OF THE INVENTION

The present invention relates in general to power amplifier drivers and, more particularly, to power amplifier drivers for use in wireless circuitry exhibiting high bandwidth at low power consumption.

In most modern radio transmitters, the transmitted signal amplitude needs to be accurately controlled to cope with existing standards. Due to manufacturing and environment variations, it is very difficult to control the amplifier's output power without any feedback, therefore, feedback is generally used to provide transmitted power control. The feedback may be realized by measuring the output power or any other parameter reflecting the output power level. The measured value is compared to a reference level and an error correction is subsequently applied to the gain control of the power amplifier to adjust the transmitted signal amplitude. The negative feedback loop allows an accurate power control as long as the measurement device and the comparison device are accurate too. Furthermore, a high gain should exist to ensure that the measurement result is actually very close to the reference, but low enough such that the control loop maintains stability.

In actual implementation, a power detector, connected to the power amplifier output through a directional coupler often realizes the power measurement. A differential amplifier realizes the signal comparison and provides the requested high gain. The implementation is not sufficient, however, to insure stability. The power amplifier, the detector and the differential amplifier are introducing cutoff frequencies and phase shifts, which could cause the system to become unstable. Since it is very difficult to remove cutoff frequencies introduced by the power amplifier, detector and signal comparator, an efficient solution is to create a dominant pole which gives the loop a first order behavior. The first order behavior is implemented using a low pass filter or by using an integrator to simultaneously create a very high open-loop gain and a dominant low frequency pole. The filter or integrator is commonly realized using operational amplifiers.

In Time Division Multiple Access (TDMA) systems, the Radio Frequency (RF) designer is tasked with another A problem. In order to limit spurious, out-of-band frequency transmission, output power transitions from low power to high power and high power to low power should be controlled, or smoothed, to limit spurious transmissions. In the transmission timeslot, the output power is at a normal operating level, however, out of the transmission timeslot, the power level should be decreased to a very low output level. Operation of the power amplifier control loop just prior to the transmission timeslot is open loop, since the control input is tied to ground potential and no output signal is transmitted. At the beginning of the transmission timeslot, the loop must be closed in a relatively short amount of time which may cause initial instability within the control loop resulting in unwanted oscillation. A simple solution is to add a fixed voltage before the transmission time slot to allow the system to quickly close the loop at the beginning of the ramp. The fixed voltage can be implemented with an operational amplifier or an acquisition device, which senses the power amplifier emission threshold. Some prior art solutions add another pole to the control loop when the acquisition circuitry is added, subsequently requiring the operational amplifier to have a higher cutoff frequency to maintain an acceptable phase margin. Other prior art solutions do not add a pole to the loop, but the automated operation of the prior art solutions are relatively complicated and limit flexibility to the RF designer.

Hence, there is a need for a power amplifier driver and associated control loop which provides adequate stability and dynamic range with adequate performance both in and out of the transmission timeslot.

BRIEF DESCRIPTION OF THE DRAWINGS

FIG. 5 is a schematic diagram of the PMOS current mirror of FIG. 4;

DETAILED DESCRIPTION OF THE DRAWINGS

Figure 1:
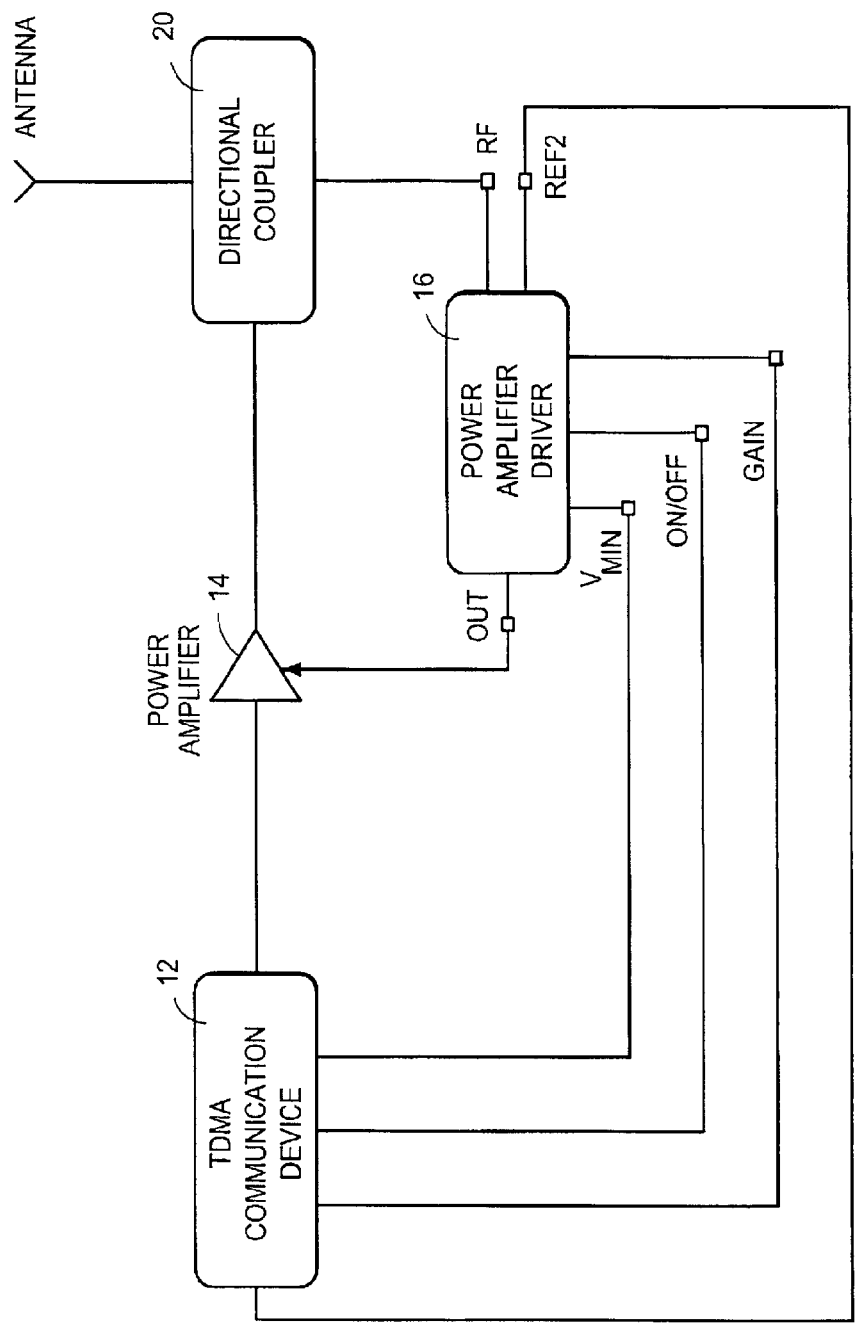
FIG. 1 is a block diagram illustrating a Time Division Multiple Access transmission system.

In FIG. 1, a TDMA transmission system 10 is illustrated. The TDMA communication device 12 generates a radio frequency (RF) signal and delivers the RF signal to power amplifier 14, which is subsequently provided to directional coupler 20. Directional coupler 20 provides both an RF signal to the antenna for long distance propagation and an RF signal to terminal RF for feedback information. The amplitude of the power provided to terminal RF is generally on the order of 30–40 dB lower than the power provided to the antenna. In other words, the power provided to terminal RF is 1000 to 10,000 times lower than the power provided to the antenna. A feedback path, therefore, exists from the antenna input to the gain control pin, OUT, of power amplifier 14 via directional coupler 20 and power amplifier driver 16. The signal delivered to the antenna is monitored by power amplifier driver 16 and a gain control signal is delivered to power amplifier 14 via the OUT terminal, constituting feedback to control the output power level of power amplifier 14. Several control signals are delivered by TDMA communication device 12 to power amplifier driver 16 via the $V_{min}$, ON/OFF, GAIN and REF2 terminals explained hereinafter. Power amplifier driver 16 may be implemented as an integrated circuit, whereby the coupled RF signal is provided as feedback to pin RF via directional coupler 20, and the control voltage responsible for controlling the output power of power amplifier 14 is provided by pin OUT.

TDMA specifications mandate that communication functions occur at specific time intervals. The time intervals are generally several microseconds in duration, for example 577 micro-seconds ($\mu$s), and are repetitive, such that 8 separate time slots exist within a first data frame before the time slots repeat in subsequent data frames. One timeslot is generally allocated for transmission, one timeslot for reception and the remaining time slots allocated for overhead functions. TDMA communication device 12 must, therefore, provide control signal ON/OFF to power amplifier driver 16 so that power amplifier 14 is on during the transmission timeslot and off during the remaining 7 timeslots. ON/OFF control is required to keep spurious transmissions, during the remaining 7 timeslots, below a maximum level threshold. TDMA communication device 12 provides $V_{min}$ to power amplifier driver 16, which subsequently provides a power amplifier control voltage at terminal OUT such that power amplifier 14 is transmitting at just below the maximum output power allowable, $P_{IDLE}$, just prior to the transmission timeslot or idle period. $V_{min}$, therefore, is said to place a bias on the gain control input to power amplifier 14, such that the output power level of power amplifier 14 is precisely at $P_{IDLE}$, during idle or non-transmission timeslots.

Power amplifier 14 exhibits non-linear power output versus input control voltage. The non-linear operation of power amplifier 14 presents a difficult problem of non-linear stability over the full range of output power for power amplifier 14. Terminal GAIN provides a programming terminal with which the closed loop stability of TDMA transmission system 10 is controlled. Terminal REF2 provides a method whereby TDMA communication device 12 can program the output power of power amplifier 14, during non-idle, or transmission timeslots.

Figure 2:
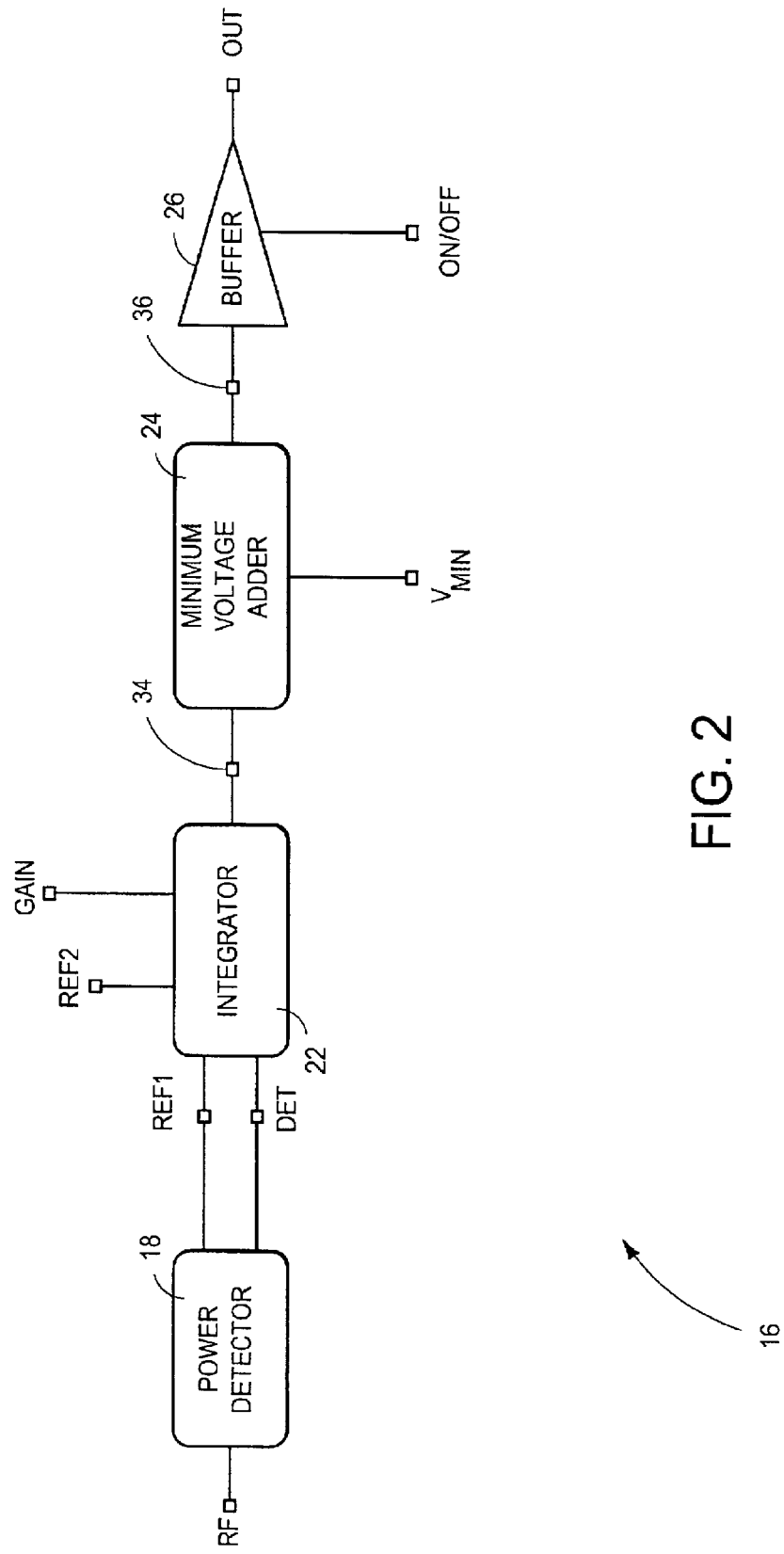
FIG. 2 is a schematic diagram illustrating the power amplifier driver of FIG. 1.

FIG. 2 illustrates the block diagram representation of power amplifier driver 16. Power detector 18 receives the RF feedback signal at terminal RF, which is representative of the RF signal sent to the antenna. Power detector 18 provides a detected power level at node DET and a reference level at node REF1 to integrator 22. The REF2 and GAIN terminals are coupled to integrator 22 to allow for output power control and loop stability performance control, respectively. Integrator 22 provides the integrated error signal at node 34 to minimum voltage adder 24. Minimum voltage adder 24 is coupled to receive an offset voltage at terminal $V_{min}$. $V_{min}$ represents the voltage required to maintain a minimum operating output power level of power amplifier 14 resulting in a transmitted power level which is just below the maximum allowable transmitted power level, $P_{IDLE}$, during idle timeslots. Buffer 26 provides a unity gain driver coupled to terminal OUT and also receives the ON/OFF control signal from TDMA communication device 12. Buffer 26 is implemented to provide sufficient current drive as required by power amplifier 14 during all timeslots. Control input from terminal ON/OFF allows the voltage at terminal OUT to correct the feedback control loop error signal developed by directional coupler 20 and power amplifier driver 16 when in the "on" state. Control input from terminal ON/OFF allows the control voltage at terminal OUT to effectively set the output power level of power amplifier 14 to zero when in the "off" state.

Figure 3:
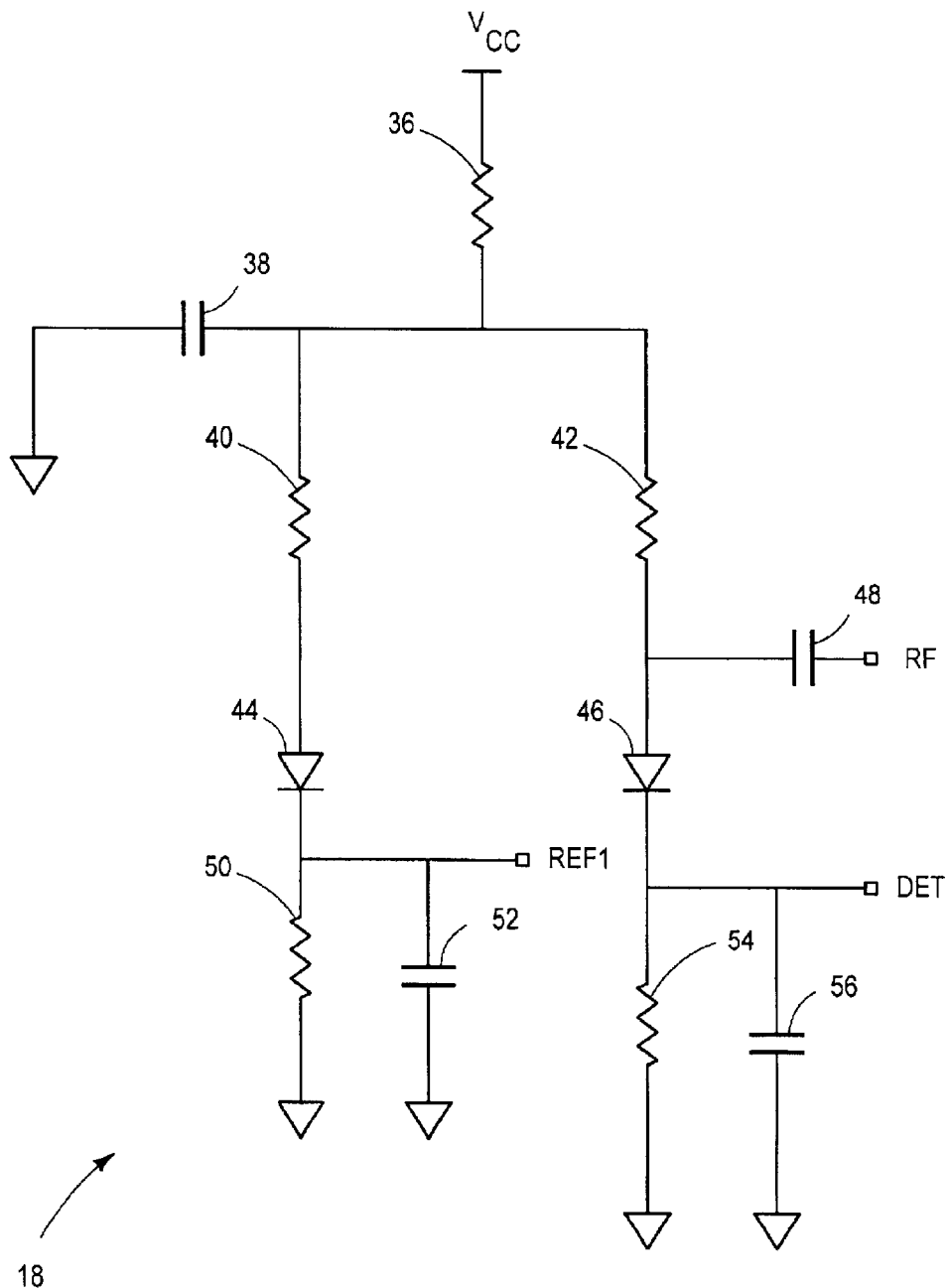
FIG. 3 is a schematic diagram illustrating the power detector of FIG. 2.

FIG. 3 illustrates a detailed schematic of power detector 18. Node RF is coupled to receive the feedback signal, which is representative of the RF signal sent to the antenna for long distance transmission, at a first terminal of capacitor 48. A second terminal of capacitor 48 is coupled to a first terminal of resistor 42 and the anode of diode 46. The cathode of diode 46 is coupled to first terminals of resistor 54 and capacitor 56 at node DET. Second terminals of resistor 54 and capacitor 56 are coupled to a first power supply potential, for example, ground potential. A second terminal of resistor 42 is coupled to first terminals of resistor 36, resistor 40 and capacitor 38. A second terminal of resistor 36 is coupled to a second power supply potential, $V_{cc}$. A second terminal of capacitor 38 is coupled to the first power supply potential, for example, ground potential. A second terminal of resistor 40 is coupled to the anode of diode 44. The cathode of diode 44 is coupled to first terminals of resistor 50 and capacitor 52 at node REF1.

Second terminals of resistor 50 and capacitor 52 are coupled to the first power supply potential, for example, ground potential. Power detector 18 comprises a two stage detection circuit. The first stage comprising diode 46, resistor 54 and capacitor 56 and the second stage comprising diode 44, resistor 50 and capacitor 52. As is known, diodes 44 and 46 are implemented either using diode devices or transistors connected as diodes. A Field Effect Transistor (FET), for example, is diode connected by coupling the gate electrode to the drain electrode to form the anode of an equivalent diode.

In operation, power detector 18 receives an RF signal at node RF and performs amplitude demodulation of the RF signal. Capacitor 48 provides Alternating Current (AC) coupling to node RF such that no Direct Current (DC) content is allowed to be introduced into power detector 18. Diode 46 provides half wave rectification of the input signal present at node RF, thus providing peak detection, or amplitude detection, of the input signal. Resistor 54 and capacitor 56 combine to form an RC filter which acts to smooth the amplitude detection signal conducted by diode 46. A top rail power supply is coupled to node $V_{cc}$ which acts to properly forward bias diodes 46 and 44. A DC signal, or bias signal, therefore exists at nodes DET and REF1, as a result of the bias signal applied to diodes 46 and 44. Resistor pair 40 and 42, diode pair 44 and 46 and RC filter pair 50,52 and 54,56 are matched, such that the bias signal present at node REF1 is substantially equivalent to the bias signal present at node DET, in the absence of an RF signal present at node RF. In the absence of an RF signal present at node RF, therefore, the signal present at nodes DET and REF1 is characterized by $V_{bias}=V_{cc}-I_d(R_{36}+R_{42})-V_{46}$, where $I_{46}$ is the current conducted by diode 46, $R_{36}$ is the resistance value of resistor 36, $R_{42}$ is the resistance value of resistor 42 and $V_{46}$ is the voltage drop across diode 46 when diode 46 is forward biased. Since the paired components mentioned earlier are matched, $V_{bias}$ is substantially equivalent at nodes DET and REF1 in the absence of an RF signal present at node RF. In the presence of an RF signal present at node RF, node DET contains two signal components, $V_{bias}$ and $V_{det}$, whereas node REF1 contains only the single component, $V_{bias}$. $V_{det}$ is the smoothed, amplitude detection signal produced by diode 46, in combination with resistor 54 and capacitor 56, which is the representation of the peak RF signal present at node RF. Power detector 18, therefore, provides an accurate power detection signal representative of the power level present at terminal RF, by providing a differential output signal at terminals DET and REF1. The differential output signal at terminals DET and REF1 contain a common mode signal equal to $V_{bias}$, which can be effectively removed by a differential amplifier, to provide a substantially error free detected output power level signal, $V_{det}$, at the output of the differential amplifier.

Figure 4:
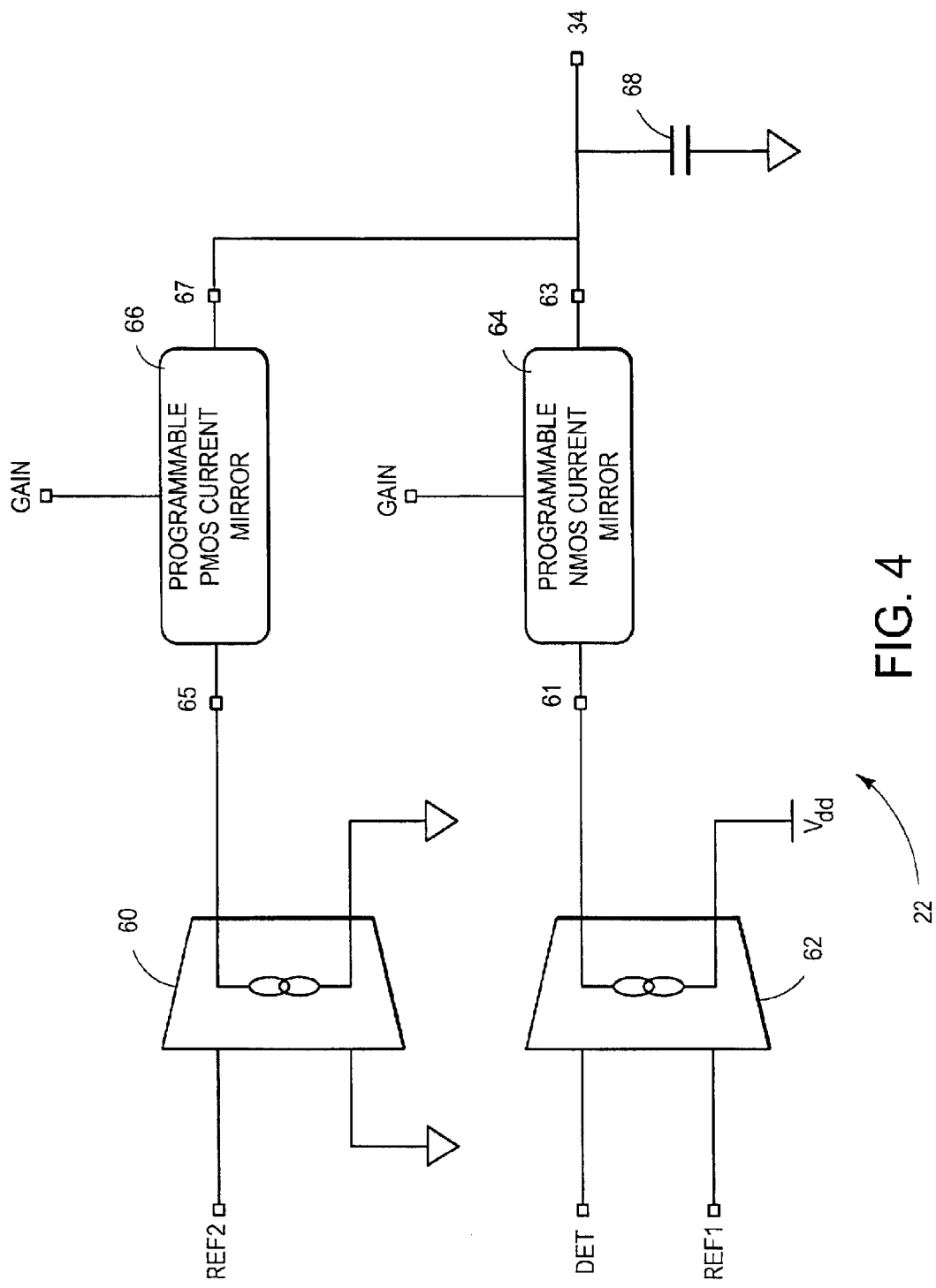
FIG. 4 is a schematic diagram illustrating the integrator of FIG. 2.

FIG. 4 illustrates a block diagram representation of integrator 22 as shown in FIG. 2. Integrator 22 comprises transconductance differential amplifiers 60 and 62. Transconductance differential amplifier 62 receives the detected amplitude of the input signal, $V_{det}$, as received at node RF from power detector 18 at node DET. Transconductance amplifier 62 also receives the common mode signal from power detector 18 at node REF1, $V_{bias}$. The common mode signal received at node REF1, as discussed earlier, is the DC bias signal produced by power detector 18 with no RF signal present at node RF. Transconductance differential amplifier 60 receives a second reference signal, REF2, produced by TDMA communication device 12.

Programmable current mirrors 64 and 66 are coupled to receive the output of transconductance amplifiers 62 and 60, respectively. Programmable current mirrors 64 and 66 are coupled to node GAIN, which is under the control of TDMA communication device 12. The first conductor of capacitor 68 is coupled to the output of programmable current mirrors 64 and 66 and to the output of integrator 22 at node 34. The second conductor of capacitor 68 is coupled to the first power supply potential, for example, ground potential.

In operation, integrator 22 performs two functions. First, integrator 22 is responsible for producing the difference signal, $V_{diff}$, which is the difference voltage between the common mode voltage, $V_{bias}$, at node REF1 and the detection voltage, $V_{det}$, at node DET, where $V_{diff}=V_{det}-V_{bias}$. The operation of transconductance amplifier 62 is to perform the voltage difference measurement and deliver the result in the form of a current. It can be said, therefore, that amplifier 62 performs in a current mode of operation to provide the voltage difference signal at node 61 in the form of a current signal. The transconductance of transconductance amplifier 62 is given by $g_{m62}=1/R=I_{52}/V_{diff}$. In other words, the output of transconductance amplifier 62 is a current signal, $I_{62}$, which is a function of the difference voltage between $V_{det}$ and $V_{bias}$, or $V_{diff}$. The transconductance of transconductance amplifier 60 is given by $g_{m60}=1/R=I_{60}/V_{REF2}$. The second input to transconductance amplifier 60 is coupled to ground potential, therefore, the output current of transconductance amplifier 60, $I_{60}$, is referenced to the input voltage present at node REF2. Programmable current mirrors 64 and 66 provide currents at nodes 63 and 67, respectively, according to the current ratio setup within each current mirror. The amount of current delivered to node 67 is equal to $I_{67}=I_{65}$*Ratio plus the effect of the GAIN signal described herein. The amount of current delivered to node 63 is $I_{63}=I_{62}$*Ratio plus the effect of the GAIN signal described herein.

The second function of integrator 22 is to provide the operating bandwidth of the power control loop established by power amplifier driver 16. By establishing the correct operating bandwidth of the power control loop, system stability is guaranteed. An important feature of integrator 22 is the minimization of the error signal resulting from the comparison of $V_{bias}$ and $V_{det}$ by transconductance amplifier 62, due to the high gain exhibited by transconductance amplifier 62. As a result, power control accuracy is enhanced with minimal sacrifice to stability.

The output current at node 34 serves to charge capacitor 68, thereby providing an error voltage across capacitor 68. The GAIN term represents the binary signal provided by TDMA communication device 12, which allows programming of programmable current mirrors 64 and 66, to change the output current mirror ratio from one ratio to a second ratio. Changing the output current mirror ratio allows modification of the control loop bandwidth without modification of passive device 68. Increasing the current ratio, for example, serves to increase the BW of the control loop providing faster loop operation. Allowing modification of the control loop bandwidth through the GAIN terminal is an important feature of integrator 22. Modification of the control bandwidth can be achieved without causing voltage glitches at the control terminal of power amplifier 14. Current glitches due to the modification of the output current mirror ratio are possible, however, but the current glitches will be integrated and will create a short slope variation at the control terminal of power amplifier 14. It should be noted that PMOS current mirror 66 sources current into capacitor 68 and NMOS current mirror 64 sinks current from capacitor 68 to control the error voltage generated at node 34.

FIG. 5 illustrates a schematic diagram of PMOS current mirror 66. The gate terminals of PMOS transistors 76, 78 and a first conductor of switch 79 are coupled to a first conductor of transistor 76 at node 65. A second conductor of switch 79 is coupled to a first conductor of switch 81 and the gate terminal of transistor 82. The GAIN node is coupled to the control terminal of switch 79 and to the input to inverter 80. A first conductor of transistors 78 and 82 are coupled together at node 67 to provide the output current, $I_{66}$, of PMOS current mirror 66.

In operation, PMOS current mirror 66 receives an input current at node 65 from transconductance amplifier 60. A low gain condition is set when GAIN is at a logic low, rendering switch 81 in a closed position and switch 79 in an open position. Transistor 82 is rendered non-conductive, therefore, $T_{66}$ is a mirrored current generated by transistor 78 in relation to the ratio of geometries between transistor 78 to transistor 76. In other words, if the geometries of transistor 78 and transistor 76 are identical, current $I_{66}$ is identical to the current conducted by transistor 76. $I_{66}$ is set according to the ratio of geometries between transistor 78 and 76 in low gain mode. A high gain condition is set when GAIN is at a logic high, rendering switch 81 in an open position and switch 79 in a closed position. Transistor 82 is rendered conductive, therefore, $I_{66}$ is a mirrored current generated by transistors 78 and 82 in relation to the ratio of geometries between transistors 78 and 82 to transistor 76. In other words, if the geometries of transistors 78, 82 and 76 are identical, current $I_{66}$ is identical to twice the amount of current conducted by transistor 76. $I_{66}$ is set according to relative geometries between transistors 78 and 82 to transistor 76 in high gain mode.

Figure 6:
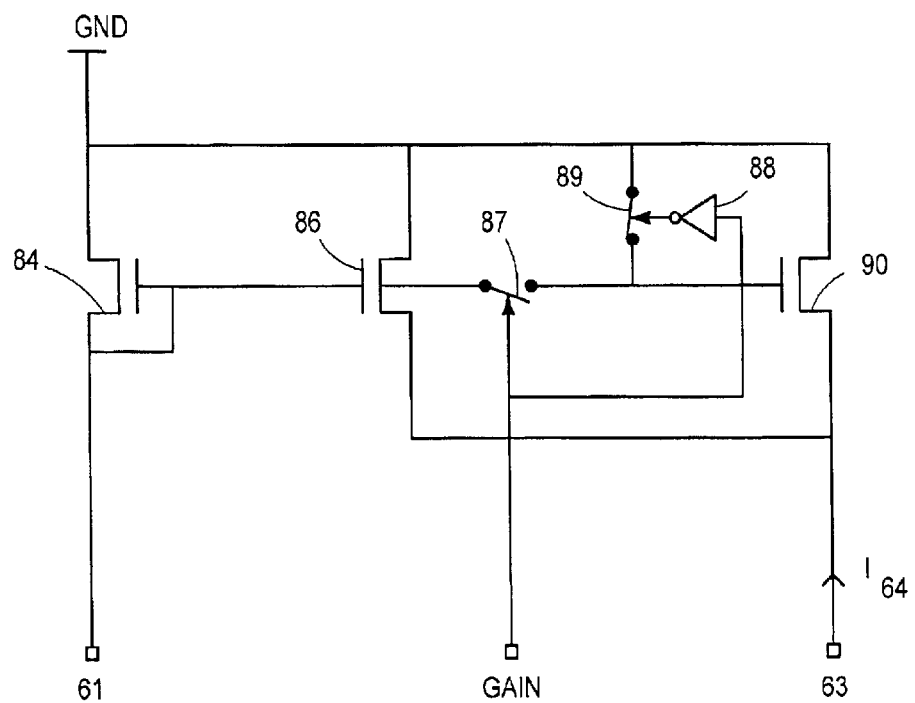
FIG. 6 is a schematic diagram of the NMOS current mirror of FIG. 4.
Figure 6:
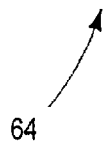

FIG. 6 illustrates a schematic diagram of NMOS current mirror 64. The gate terminals of NMOS transistors 84, 86 and a first conductor of switch 87 are coupled to a first conductor of transistor 84 at node 61. A second conductor of switch 87 is coupled to a first conductor of switch 89 and to the gate terminal of transistor 90. The GAIN node is coupled to the control terminal of switch 87 and the input to inverter 88. A first conductor of transistors 86 and 90 are coupled together at node 63 to create the output current, $I_{64}$, of NMOS current mirror 64.

In operation, NMOS current mirror 64 receives an input current at node 61 from transconductance amplifier 62. A low gain condition is set when GAIN is at a logic low, rendering switch 89 in a closed position and switch 87 in an open position. Transistor 90 is rendered non-conductive, therefore, $I_{64}$ is a mirrored current generated by transistor 86 in relation to the ratio of geometries between transistor 86 to transistor 84. In other words, if the geometries of transistor 84 and transistor 86 are identical, current $I_{64}$ is identical to the current conducted by transistor 84. $I_{64}$ is set according to the ratio of geometries between transistor 84 and 86 in low gain mode. A high gain condition is set when GAIN is at a logic high, rendering switch 89 in an open position and switch 87 in a closed position. Transistor 90 is rendered conductive, therefore, $I_{64}$ is a mirrored current generated by transistors 86 and 90 in relation to the ratio of geometries between transistors 86 and 90 to transistor 84. In other words, if the geometries of transistors 84, 86 and 90 are identical, current $I_{64}$ is identical to twice the amount of current conducted by transistor 84. $I_{64}$ is set according to relative geometries between transistors 86 and 90 to transistor 84 in high gain mode.

Figure 7:
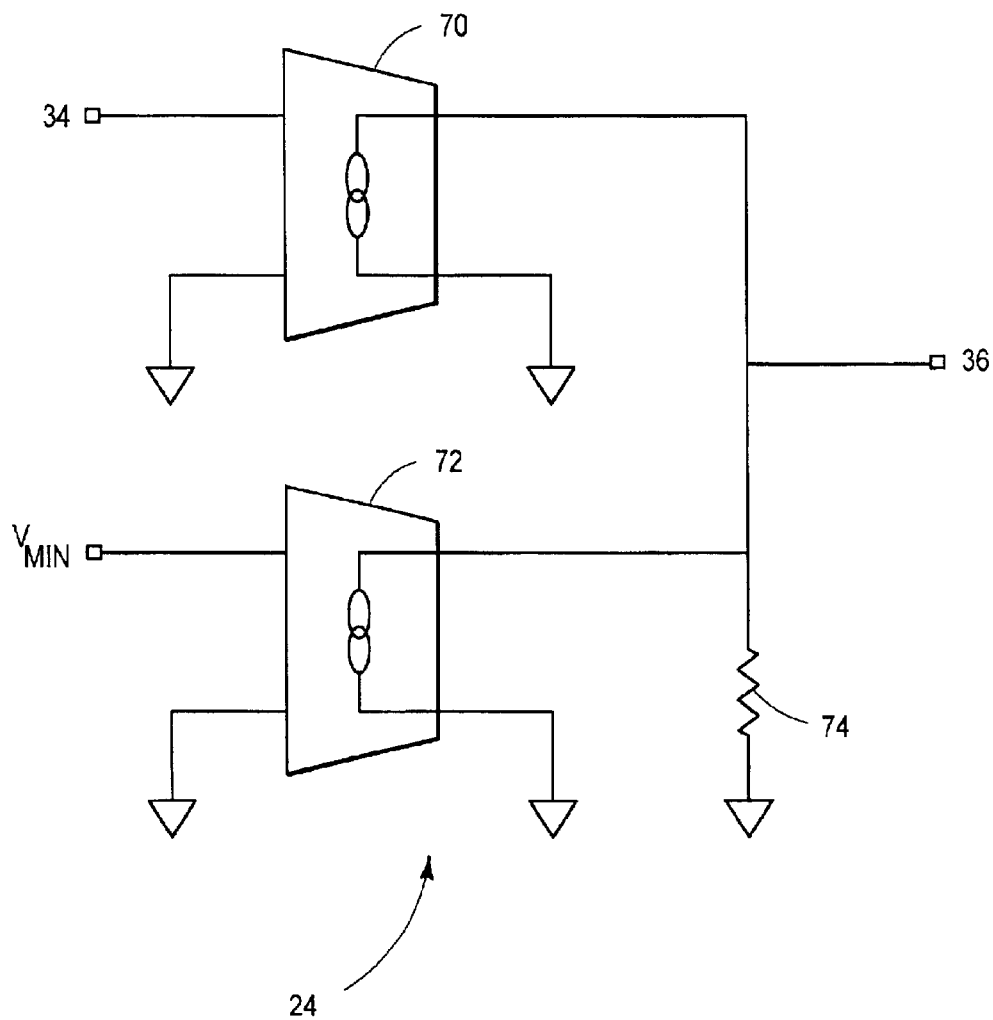
FIG. 7 is a schematic diagram illustrating the minimum voltage adder of FIG. 2.

Minimum voltage adder 24 is illustrated in FIG. 7. Minimum voltage adder 24 receives the output of integrator 22 at node 34, which represents the error voltage of the control loop, as discussed earlier. Minimum voltage adder comprises transconductance amplifiers 70 and 72 along with resistor 74. Transconductance amplifier 70 receives the error voltage, $V_{error}$, at node 34 and converts the error voltage to a current, $I_{70}$, at node 36, where $I_{70}=V_{error}/R$. Transconductance amplifier 72 receives external control signal $V_{min}$ from TDMA communication device 12. The external control signal $V_{min}$ is then converted to a current by transconductance amplifier 72 and supplied to node 36. A first terminal of resistor 74 is coupled to terminal 36 and a second terminal of resistor 74 is coupled to the first power supply potential, for example, ground potential.

Control signal $V_{min}$, as discussed earlier, provides a minimum control voltage level to power amplifier 14, such that the output power level of power amplifier 14 is just below the maximum allowable power level during idle timeslots, $P_{IDLE}$. In operation, minimum voltage adder 24 receives the error voltage, $V_{error}$, and the external control voltage, $V_{min}$, and converts the error voltage and external control voltage to a current. The current signals are summed at node 36 and are subsequently converted back into voltage by the operation of resistor 74. The voltage at node 36 is characterized by $$V_{36} = \left(\frac{1}{R}\sum V_i\right)R_{74},$$

where the summation of voltages, $V_i$, represents the summation of $V_{error}$ and $V_{min}$ and $1/R$ is the transconductance term of transconductance amplifiers 70 and 72. $R_{74}$ is the resistance value of resistor 74.

Due to the high output impedance of transconductance amplifiers 70 and 72, a buffer is required between minimum voltage adder 24 and the control input to power amplifier 14. Buffer 26 is therefore placed between the output of minimum voltage adder 24 and the control input of power amplifier 14, so that the current required by the control input of power amplifier 14 can be sourced by buffer 26. An input control terminal, ON/OFF, is provided by buffer 26. Terminal ON/OFF is controlled by TDMA communication device 12 in order to control the output power level of power amplifier 14. TDMA communication device 12 programs the ON/OFF terminal to the "on" state, thereby allowing buffer 26 to propagate the control voltage from minimum voltage adder 24 at node 36 to the control terminal of power amplifier 14 through node OUT. TDMA communication device 12 programs power amplifier 14 to the "off" state by activating the OFF control signal at terminal ON/OFF. Programming buffer 26 to the OFF state, prohibits the control voltage at node 36 to propagate to power amplifier 14, thereby reducing the output power level of power amplifier 14 to a minimum value.

By now it should be appreciated that a power amplifier driver circuit and a method for operating the power amplifier driver has been presented. Advantages of the power amplifier driver are realized by providing transconductance amplifiers to perform the integration and minimum voltage adder functions. Transconductance amplifiers provide higher bandwidth as compared to the operational amplifier counterparts, thereby allowing operation without employing low frequency poles to affect the overall stability of the control loop.

What is claimed is:

1. In a time division multiple access transmission device, a power amplifier driver providing a control signal in response to an error signal, the power amplifier driver comprising:

a detector (18) having an input coupled to receive a signal representative of a transmission level and coupled to provide a detector signal operating in a first mode, wherein the detector comprises
 a first detection stage (46, 54, 56) having an input coupled to receive the signal representative of the transmission level, a power supply input coupled to receive a first supply potential and an output coupled to provide the detector signal; and
 a second detection stage (44, 50, 52) having a power supply input coupled to receive the first supply potential and an output coupled to provide a reference signal; and
an error generator (22) coupled to receive the detector signal and a reference signal and coupled to provide a difference signal operating in a second mode to control the transmission level.

2. The power amplifier driver of claim 1, wherein the first detection stage comprises:
 a rectifier (46) having an input coupled to receive the signal representative of the transmission level; and
 a filter (54,56) having an input coupled to an output of the diode and an output coupled to provide the detector signal.

3. The power amplifier driver of claim 1, wherein the second detection stage comprises:
 a rectifier (44) having an input coupled to receive the first supply potential; and
 a filter (50,52) having an input coupled to an output of the diode and an output coupled to provide the reference signal.

4. The power amplifier driver of claim 1, wherein the error generator comprises:
 a first conversion device (60) coupled to receive the reference signal and having an output coupled to a first node;
 a second conversion device (62) coupled to receive the detector signal and having an output coupled to the first node; and
 a gain control device (64) having an input coupled to the first node, a control input coupled to receive a gain control signal and coupled to provide the difference signal.

5. The power amplifier driver of claim 4, wherein the first conversion device includes a transconductance amplifier having a first input coupled to receive the reference signal, a second input coupled to a first supply potential, a first output coupled to the first node and a second output coupled to the first supply potential.

6. The power amplifier driver of claim 4, wherein the second conversion device includes a transconductance amplifier having a first input coupled to receive the detector signal, a second input coupled to a first supply potential, a first output coupled to the first node and a second output coupled to the first supply potential.

7. The power amplifier driver of claim 4, wherein the gain control device includes a programmable current mirror coupled to receive the gain control signal.

8. A power amplifier driver operative to control a transmission level of a power amplifier between first and second levels, the power amplifier driver comprising;
 a first conversion circuit (18,22) coupled to receive a first feedback signal in a first mode indicative of the first level and coupled to convert the first feedback signal to a second feedback signal in a second mode, wherein the first conversion circuit comprises a power detector (18) coupled to receive the first feedback signal; and an integrator (22) coupled to receive first and second outputs of the power detector and coupled to convert the first feedback signal to the second feedback signal; and a second conversion circuit (24) coupled to receive the second feedback signal and a bias signal indicative of the second level and coupled to provide a control signal indicative of the first and second levels at a first node.

9. The power amplifier driver of claim 8, wherein the power detector comprises:

a first detection stage (46, 54, 56) having an input coupled to receive the first feedback signal, a power supply input coupled to receive a first supply potential and an output coupled to provide a detection signal; and a second detection stage (44, 50, 52) having a power supply input coupled to receive the first supply potential and an output coupled to provide a reference signal.

10. The power amplifier driver of claim 9, wherein the first detection stage comprises:

a rectifier (46) having an input coupled to receive the first feedback signal; and a filter (54,56) having an input coupled to an output of the diode and an output coupled to provide the detection signal.

11. The power amplifier driver of claim 9, wherein the second detection stage comprises:

a rectifier (44) having an input coupled to receive the first supply potential; and a filter (50,52) having an input coupled to an output of the diode and an output coupled to provide the reference signal.

12. The power amplifier driver circuit of claim 8, wherein the integrator comprises:

a first conversion device (60) coupled to receive the first power detector output and having an output coupled to a first node;

a second conversion device (62) coupled to receive the second power detector output and having an output coupled to the first node; and a gain control device (64) having an input coupled to the first node, a control input coupled to receive a gain control signal.

13. The power amplifier driver of claim 12, wherein the first conversion device includes a transconductance amplifier having a first input coupled to receive the first power detector output, a second input coupled to a first supply potential, a first output coupled to the first node and a second output coupled to the first supply potential.

14. The power amplifier driver of claim 12, wherein the second conversion device includes a transconductance amplifier having a first input coupled to receive the second power detector output, a second input coupled to a first supply potential, a first output coupled to the first node and a second output coupled to the first supply potential.

15. The power amplifier driver of claim 12, wherein the gain control device includes a programmable current mirror coupled to receive the gain control signal.

16. The power amplifier driver of claim 8, wherein the second conversion circuit comprises:

a first transconductance amplifier (70) having a first input coupled to receive the second feedback signal, a second input coupled to a first supply potential, a first output coupled to the first node and a second output coupled to the first supply potential; and a second transconductance amplifier (72) having a first input coupled to receive the bias signal, a second input coupled to the first supply potential, a first output coupled to the first node and a second output coupled to the first supply potential.

17. An integrated circuit containing a power amplifier driver receiving a feedback signal at a first pin and providing a control signal at a second pin to control a transmitted power level, the integrated circuit comprising:

an integrator (22) having a first input coupled to receive a detection voltage indicative of a first level, a second input coupled to receive a gain voltage and an output coupled to provide a transconductance error signal; and a summing device (24) coupled to receive the transconductance error signal and a bias signal and coupled to provide the control signal in response to the error and bias signals.

18. The integrated circuit of claim 17, wherein the integrator comprises:

a conversion device (62) coupled to receive the detection voltage and having an output coupled to a first node; and a gain control device (64) having an input coupled to the first node and a control input coupled to receive the gain voltage.

19. The power amplifier driver of claim 18, wherein the conversion device includes a transconductance amplifier having a first input coupled to receive the detection voltage, a second input coupled to a first supply potential, a first output coupled to the first node and a second output coupled to the first supply potential.

* * * * *